(12) United States Patent
Dunlop

(10) Patent No.: US 11,071,201 B2
(45) Date of Patent: Jul. 20, 2021

(54) METHOD AND APPARATUS FOR TERMINATING AN ELECTRICAL CABLE TO AN INTEGRATED CIRCUIT

(71) Applicant: SAMTEC, INC., New Albany, IN (US)

(72) Inventor: James Dunlop, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 16/764,311

(22) PCT Filed: Nov. 14, 2018

(86) PCT No.: PCT/US2018/060929
§ 371 (c)(1),
(2) Date: May 14, 2020

(87) PCT Pub. No.: WO2019/099450
PCT Pub. Date: May 23, 2019

(65) Prior Publication Data
US 2020/0375032 A1 Nov. 26, 2020

Related U.S. Application Data

(60) Provisional application No. 62/586,119, filed on Nov. 14, 2017.

(51) Int. Cl.
*H05K 1/11* (2006.01)
*H01R 12/53* (2011.01)
*H05K 1/02* (2006.01)

(52) U.S. Cl.
CPC ............ *H05K 1/111* (2013.01); *H01R 12/53* (2013.01); *H05K 1/0296* (2013.01);
(Continued)

(58) Field of Classification Search
CPC ............... H05K 1/111; H05K 1/0296; H05K 2201/09236; H05K 2201/10356; H05K 2201/0919; H01R 12/53
(Continued)

(56) References Cited

U.S. PATENT DOCUMENTS 5,764,489 A * 6/1998 Leigh .................. H05K 1/0219
174/261
7,214,097 B1 5/2007 Hsu et al.
(Continued)

FOREIGN PATENT DOCUMENTS

| JP | 2003-338693 A | 11/2003 |
|----|---------------|---------|
| JP | 2009-176893 A | 8/2009 |
| JP | 2014-183290 A | 9/2014 |

OTHER PUBLICATIONS

Zhang H, Li X, Mao J. A Low-Loss Board-to-Cable Connector with Stepwise Structures, In2019 Cross Strait Quad-Regional Radio Science and Wireless Technology Conference (CSQRWC) Jul. 18, 2019 (pp. 1-3), IEEE.

*Primary Examiner* — Sherman Ng
(74) *Attorney, Agent, or Firm* — BakerHostetler

(57) ABSTRACT

An electrical component is configured to allow electrical cables to be mounted directly to a package substrate, such that electrical traces of the package substrate directly place the electrical cables in electrical communication with an integrated circuit that is mounted to the package substrate without passing through any separable interfaces of an electrical connector.

21 Claims, 5 Drawing Sheets

(52) U.S. Cl.
CPC ............ *H05K 2201/094* (2013.01); *H05K 2201/09236* (2013.01); *H05K 2201/10356* (2013.01)

(58) Field of Classification Search
USPC ........................................ 174/250
See application file for complete search history.

(56) References Cited

U.S. PATENT DOCUMENTS

| | | |
|---|---|---|
| 9,374,892 B1 | 6/2016 | Mobley et al. |
| 9,660,364 B2 | 5/2017 | Wig et al. |
| 9,691,634 B2 | 6/2017 | Koelling |
| 2004/0057220 A1 | 3/2004 | Tamaki et al. |
| 2004/0218372 A1 | 11/2004 | Hamasaki et al. |
| 2006/0035510 A1 | 2/2006 | Numata et al. |
| 2009/0104813 A1 | 4/2009 | Chen et al. |
| 2013/0225004 A1* | 8/2013 | Behziz ............ H05K 1/117 439/656 |

* cited by examiner

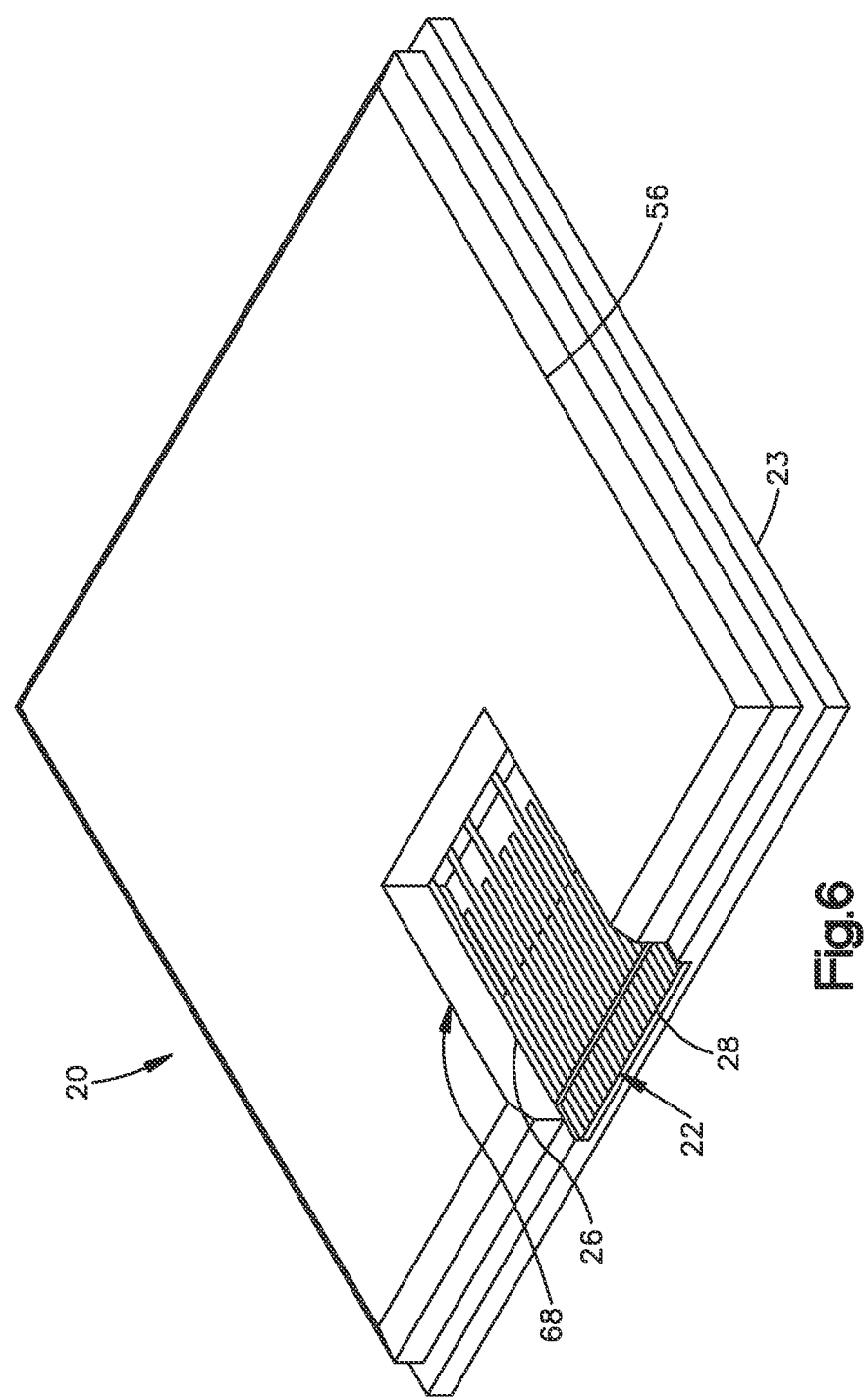

US 11,071,201 B2

METHOD AND APPARATUS FOR TERMINATING AN ELECTRICAL CABLE TO AN INTEGRATED CIRCUIT

CROSS-REFERENCE TO RELATED APPLICATIONS

This application is the National Stage Application of International Patent Application No. PCT/US2018/060929, filed Nov. 14, 2018, which claims priority to U.S. Patent Application Ser. No. 62/586,119 filed Nov. 14, 2017, the disclosure of which his hereby incorporated by reference as if set forth in its entirety herein.

BACKGROUND

Data communication systems continue to demand increasing data transfer speeds while maintaining suitable signal integrity. Some data communication system architectures include electrical cables that are placed in electrical communication with integrated circuits, such as application specific integrated circuits (ASICs). One such data communication system described in U.S. Pat. No. 9,660,364 includes electrical cables that terminate at an electrical connector, such as a topside connector or edge connector. The electrical connector, in turn, electrically couples the electrical cables to the package substrate, and ultimately to the integrated circuit that is mounted to the package substrate.

SUMMARY

In one example, present disclosure describes an electrical component. The electrical component can include a substrate having a first layer and a second layer adjacent the first layer, an integrated circuit mounted to the first layer, such that an electrical signal trace of the substrate are in electrical communication with the integrated circuit. An electrical signal conductor of an electrical cable can be configured to be mounted to the first layer so as to be placed in electrical communication with the integrated circuit along the electrical signal trace of the substrate, and an electrical ground of the electrical cable that is electrically insulated from the electrical signal conductor can be configured to be mounted to the second layer.

BRIEF DESCRIPTION OF THE DRAWINGS

Any feature or combination of features described herein are included within the scope of the present disclosure provided that the features included in any such combination are not mutually inconsistent as will be apparent from the context, this specification, and the knowledge of one of ordinary skill in the art. Additional advantages and aspects of the present disclosure are apparent in the following detailed description and claims, and the following drawings in which:

FIG. 6 is a perspective view of the electrical component illustrated in FIG. 1, including a cover attached to the package substrate.

DETAILED DESCRIPTION

Figure 1:
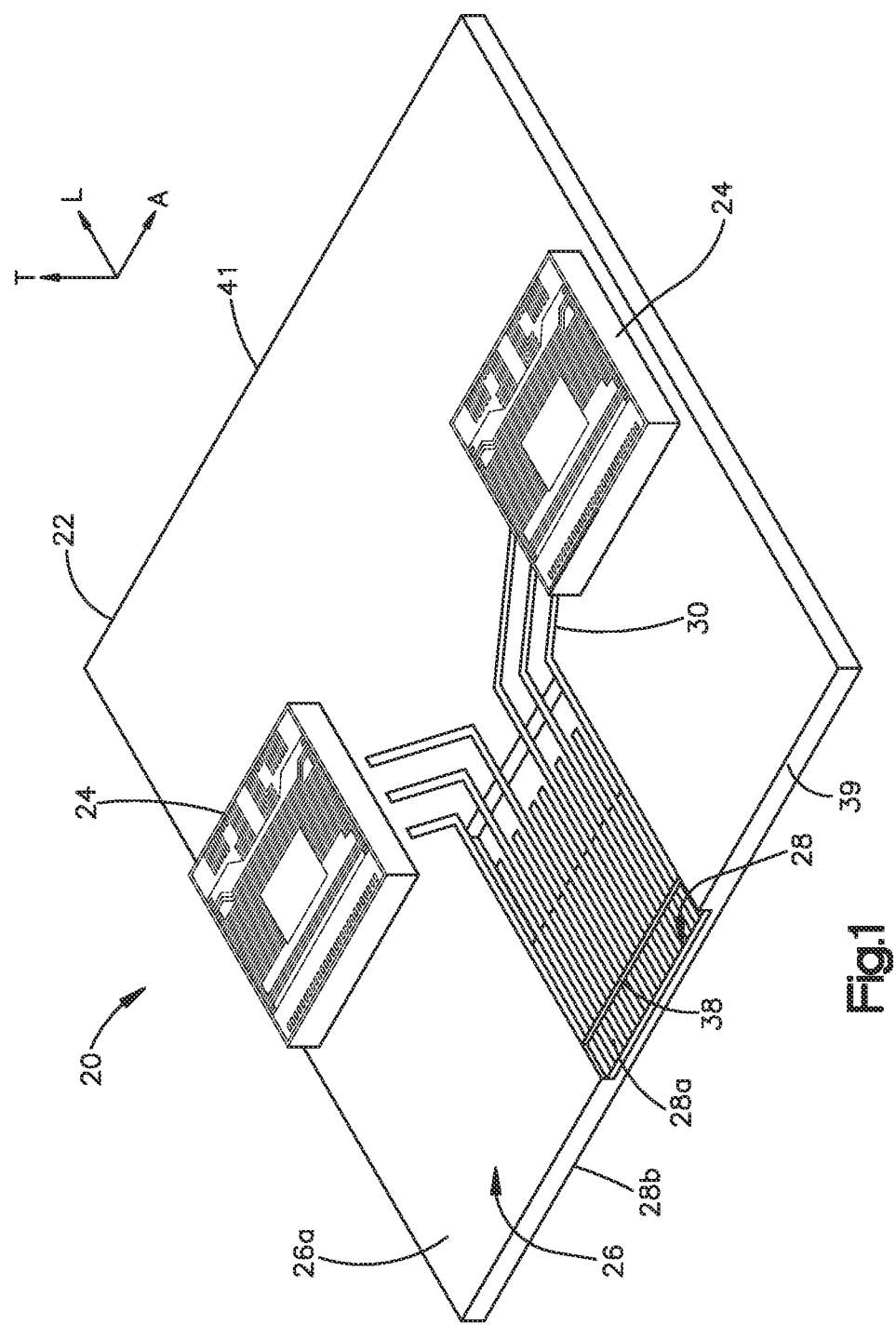
FIG. 1 is a schematic perspective view of an electrical component including a multilayer package substrate and at least one integrated circuit mounted to the package substrate.

Referring to FIGS. 1-4B, an electrical component 20 can be configured as an integrated circuit package. The electrical component 20 can thus include a first substrate that can be referred to as a package substrate 22, and at least one integrated circuit 24 mounted to the package substrate 22. For instance, the electrical component 20 can include a plurality of integrated circuits 24 mounted to the package substrate 22. The integrated circuits 24 can be configured as an application-specific integrated circuit (ASIC), though it should be appreciated that the integrated circuits 24 can be any suitable alternative integrated circuit as a desired, such as a general purpose integrated circuit.

The package substrate 22 can include a first layer 26 and a second layer 28 adjacent the first layer along a first direction. The first direction can be oriented along a transverse direction T. The package substrate 22 can be planar along a plane that is defined by a longitudinal direction L that is perpendicular to the transverse direction T, and a lateral direction A that is perpendicular to each of the longitudinal direction L and the transverse direction T. The transverse direction T can be oriented along the vertical direction as shown, and each of the longitudinal direction L and the lateral direction A can be oriented along a horizontal direction as shown. It should be appreciated, however, that these directions can vary depending on the orientation of the electrical component 20 during use.

The first layer 26 can define a respective first surface 26a that faces away from the second layer 28. The second layer 28 defines a second surface 28b that faces away from the first layer 26. The first and second surfaces 26a and 28b can be opposite each other along the transverse direction. The first and second layers 26 and 28 can be separate from each other and fused together. Alternatively, the first and second layers can be monolithic with each other. The first layer 26 can further define a respective second surface 26b opposite the respective first surface 26a along the transverse direction T. Similarly, the second layer 28 can define a respective first surface 28a opposite the second surface 28b along the first direction. The first surface 28a of the second layer 28 can face the second surface 26b of the first layer 26. For instance, the first surface 28a of the second layer 28 can abut the second surface 26b of the first layer 26.

In one example, the package substrate 22 can be fabricated so as to define an interface between the first layer 26 and the second layer 28. In this regard, the package substrate 22 can define the interface between the first layer 26 and the second layer 28 whether the first and second layers are separate from each other or monolithic with each other. Further, the first surface 26a of the first layer 26 can be said to define an upper surface of the package substrate 22, and the second surface 28b of the second layer 28 can be said to define a lower surface of the package substrate 22, it being appreciated again that the orientation of the package substrate 22 can differ from the orientation illustrated during use.

In one example, the package substrate 22 can be a glass substrate. Thus, one or both of the first and second layers 26 and 28 can be made of glass. The glass substrate can be made from borosilicate in one example. In another example, the glass substrate can be made of quartz. Alternatively still, the glass substrate can be made from one or more up to all of borosilicate, aluminasilicate, and quartz including single-crystal quartz, and synthetic quartz. When the package substrate 22 is made of glass, the package substrate can alternatively be made of any suitable alternative glass substrate materials or combinations thereof. Alternatively still, the substrate 22 can be made of any suitable non-glass material as desired. Thus, either or both of the first and second layers 26 and 28 can be made of a non-glass material. In other example, the package substrate 22 can be made of sapphire, silicon, zinc oxide, zirconium oxide, including yttria-stabilized zirconium oxide, ceramic, or combinations thereof. In certain examples, the package substrate 22 can be made of a lead-free glass, meaning that the glass substrate can be free of lead including lead oxides, lead alloys, lead compounds, and all lead constituents. Alternatively, the glass substrate can contain a quantity of lead as desired. The term "lead-free," "free of lead," and derivatives thereof can mean that means that the quantity of lead is in accordance with the Restriction of Hazardous Substances Directive (RoHS) specifications. In one example, the term "lead-free," "free of lead," and derivatives thereof can mean that means that the quantity of lead is less than 0.1% by weight. Alternatively or additionally, the term "lead-free," "free of lead," and derivatives thereof can mean that the quantity of lead is less than 0.1% by volume. In another example, the term "lead-free," "free of lead," and derivatives thereof can mean that means that the quantity of lead is less than 100 parts per million (ppm).

The integrated circuit 24 can be mounted to the first layer 26. In particular, the integrated circuit 24 can be mounted to the first surface 26a of the first layer 26, such that the first layer 26 is disposed between the integrated circuit 24 and the second layer 28 with respect to the transverse direction T. The electrical component 20 can further include a second substrate 23 that can be configured as a printed circuit board. The package substrate 22 can be mounted to the second substrate 23 so as to establish an electrical connection therebetween, as described in more detail below.

The second layer 28, and in particular the second surface 28b, can be mounted to the second substrate 23, such that the second layer 28 is disposed between the second substrate 23 and the first layer 26. The package substrate 22 can include at least one electrical signal trace 30 such as a plurality of electrical signal traces 30 that are in electrical communication with the integrated circuit 24. In one example, the first layer 26 can include the at least one electrical signal trace 30. The electrical signal traces 30 can extend to the integrated circuit 24. That is, the integrated circuit 24 can be mounted to the package substrate 22, such that the electrical signal traces are placed in direct contact with the integrated circuit 24. In one example, at least a portion of the electrical signal traces 30 up to an entirety of the portion of the electrical signal traces 30 can extend along the first surface 26a of the first layer 26. It should be appreciated, however, that the electrical signal traces 30 can be carried by the substrate 22 in any manner as desired. For instance, alternatively or additionally, at least a portion of the electrical signal traces 30 can be carried by the substrate 22 at a location between and including the first surface 26a of the first layer 26 and the second surface 26b of the first layer 26. Thus, at least a portion of the electrical signal traces 30 can be embedded in the first layer 26 between the first surface 26a and the second surface 26b. It should be appreciated, however, that at least a portion of the electrical signal traces 30 can be disposed anywhere in the package substrate 22 from and including the first surface 26a to and including the second surface 28b.

The package substrate 22 can further include at least one electrical ground trace 45 such as a plurality of electrical ground traces 45 that are in electrical communication with the integrated circuit 24. For instance, the second layer 28 can include the at least one electrical ground trace 45. The electrical ground traces 45 can extend to the integrated circuit 24. That is, the integrated circuit 24 can be mounted to the package substrate 22, such that the electrical ground traces 45 are placed in direct contact with the integrated circuit 24. In one example, at least a portion of the electrical ground traces 45 up to an entirety of the portion of the electrical ground traces 45 can extend along the first surface 28a of the second layer 28. It should be appreciated, however, that the electrical ground traces 45 can be carried by the substrate 22 in any manner as desired. For instance, alternatively or additionally, at least a portion of the electrical ground traces 45 can be carried by the substrate 22 at a location between and including the first surface 28a of the second layer 28 and the second surface 28b of the second layer 28. Thus, at least a portion of the electrical ground traces 45 can be embedded in the second layer 28 between the first surface 28a and the second surface 28b. It should be appreciated, however, that at least a portion of the electrical ground traces 45 can be disposed anywhere in the package substrate 22 from and including the first surface 26a to and including the second surface 28b.

The electrical component 20 can include at least one electrical cable 32 that is configured to be placed in electrical communication with a respective at least one integrated circuit 24. In particular, the at least one electrical cable 32 can be mounted to the package substrate 22, such that the package substrate 22 places the at least one electrical cable 32 in electrical communication with the respective at least one integrated circuit 24. The electrical cable 32 can include at least one electrical signal conductor 34 and at least one ground 36 that is electrically isolated from the electrical signal conductor 34. Each of the electrical cables 32 can further include an electrical shield 33 that provides electrical shielding for the respective at least one electrical signal conductor 34. The electrical cables 32 can be configured as a coaxial cable, a twin-axial cable, a multi-conductor cable as desired. The electrical cables 32 can be configured as individualized cables or bundles or ribbons of cables. For instance, a plurality up to all of the electrical cables 32 can be configured as a flex circuit.

The electrical cables 32 can be mounted to the package substrate 22 such that the electrical signal conductors 34 are placed in electrical communication with the respective at least one of the integrated circuit 24 along a respective at least one of the electrical signal traces 30. Further, the electrical cables 32 can be mounted to the package substrate 22 such that the grounds 36 are placed in electrical communication with the respective at least one of the integrated circuit 24 along a respective at least one of the electrical ground traces 45. In particular, as will now be described, the package substrate 22 can be configured such that the electrical signal conductors 34 are mounted to the first layer 26, and the electrical grounds 36 are mounted to the second layer 28.

The electrical signal conductors 34 are configured to be mounted to the first layer 26 so as to be placed in electrical communication with respective ones of the electrical signal traces 30. Thus, the electrical signal conductors 34 can be placed in electrical communication with the integrated circuit 24 along the respective at least one of the electrical signal traces 30. The electrical grounds 36 are configured to be mounted to the second layer 28 so as to be placed in electrical communication with respective ones of the electrical ground traces 45 of the second layer 28. Thus, the electrical grounds 36 can be further placed in electrical communication with the integrated circuit 24 along the respective at least one of the electrical ground traces 45.

When a plurality of electrical cables 32 are mounted to the package substrate 22, the electrical signal traces 30 can place respective ones of the signal conductors 34 of the electrical cables 32 in electrical communication with respective different ones of the integrated circuits 24. Thus, the electrical signal conductors 34 are configured to be placed in electrical communication with the respective integrated circuits 24 along the respective ones of the electrical signal traces 30 of the substrate 22. Similarly, when a plurality of electrical cables 32 are mounted to the package substrate 22, the electrical ground traces 45 can place respective ones of the electrical grounds of the electrical cables 32 in electrical communication with respective different ones of the integrated circuits 24. Thus, the electrical grounds 36 are configured to be placed in electrical communication with the integrated circuit 24 along the respective ones of the electrical ground traces 45 of the substrate 22.

In particular, the electrical signal conductors 34 are configured to be mounted to a respective one of a plurality of first or signal electrical contact members that are disposed on the first surface 26a of the first layer 26. The first electrical contact members can be configured as first electrical contact pads 38 that are in electrical communication with respective ones of the electrical signal traces 30. For instance, the electrical signal traces 30 can extend from the electrical contact pads 38 or alternatively constructed first electrical contact members. In one example, the signal traces 30 can be monolithic with the first contact pads 38. Further, in one example, the signal traces 30 and the first contact pads 38 do not define a separable interface. That is, the signal traces 30 are not designed to be separated from the contact pads 38 without rendering the package substrate 22 inoperable. The first electrical contact pads 38 can also be referred to as signal contact pads. At least some up to all of the electrical signal traces 30 can extend from respective ones of the electrical contact pads 38 to a respective one of the at least one integrated circuit 24.

Advantageously, the signal conductors 34 of the electrical cables 32 can be mounted to respective ones of the first electrical contact pads 38, such that electrical signals can travel between the electrical cables 32 and the integrated circuit 24 along the electrical signal traces 30 of the substrate 22 without passing through any separable interfaces of electrical connectors. Therefore, the electrical signals avoid signal degradation that can occur across such separable interfaces in conventional systems. This advantage can be useful, particularly when transmitting signals at high data transfer speeds. In this regard, it should be appreciated that the electrical signal traces 30 can establish respective electrical paths from the first contact pad 38 to the integrated circuit 24 without passing across a separable interface of an electrical connector. Thus, it can also be said that at least one up to all of the electrical signal traces 30 can extend continuously and uninterrupted from a respective one of the first contact pads 38 to a respective one of the at least one integrated circuit 24. Thus, data travelling along the signal traces 30 can travel between the respective electrical cables and the integrated circuit along continuous and uninterrupted respective data communication paths.

Figure 3:
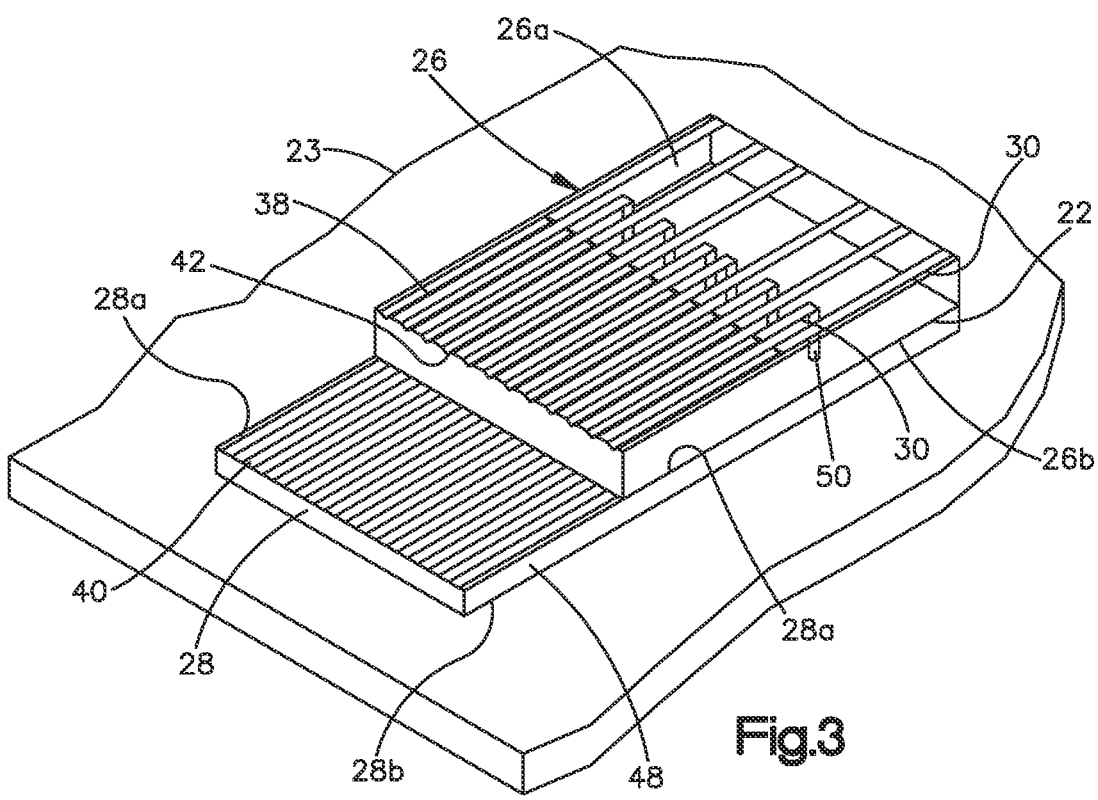
FIG. 3 is an enlarged perspective view of a portion of a first layer of the package substrate illustrated in FIG. 2 constructed in accordance with another embodiment, showing a plurality of electrical cables mounted to the package substrate.
Figure 4A:
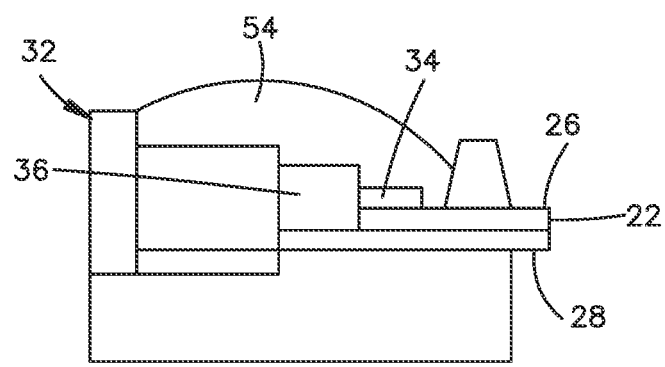
FIG. 4A is a sectional side elevation view of the portion of the electrical component illustrated in FIG. 1, showing an electrical cable mounted to the package substrate.
Figure 4B:
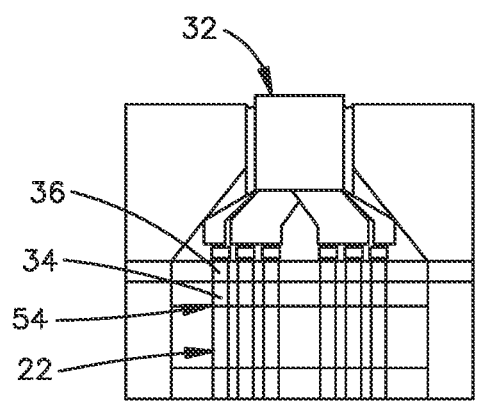
FIG. 4B is a top plan view of the portion of the electrical component illustrated in FIG. 4A.

It should be appreciated that some up to all of the first contact pads 38 can be in communication with the integrated circuit 24 along respective ones of the signal traces 30. Alternatively or additionally, some of the contact pads 38 can be placed in electrical communication with the second substrate 23. In particular, as illustrated in FIG. 3, the package substrate 22 can include electrically conductive signal vias 50 that extend from respective ones of the signal traces 30 through the substrate 22 so as to mount to the second substrate 23. The electrically conductive signal vias 50 can extend through the first and second layers 26 and 28 along the transverse direction T. In particular, the electrically conductive signal vias 50 can extend from the first surface 26a of the first layer 26 to the second surface 26b of the second layer 28. The signal vias 50 can extend from respective ones of the signal traces 30 that extend from the first contact pads 38. The signal traces 30 that extend from the first contact pads 38 to respective signal vias 50 can terminate at the signal vias 50 without extending to the integrated circuit 24. The signal traces 30 that extend to the respective one of the at least one integrated circuit 24 can extend uninterrupted to the respective one of the at least one integrated circuit 24 without extending across, past, or through any signal vias 50. Thus, the signal traces 30 that extend to the respective one of the at least one integrated circuit 24 can extend uninterrupted to the respective one of the at least one integrated circuit 24 while maintaining electrical isolation from the signal vias 50 with respect to data transmission.

The signal vias 50 can be metalized, and thus electrically conductive along an entirety of their length. The metallization can be achieved using thin film technology. Alternatively, the metallization can be achieved using thick film technology. Alternatively still, a metal powder can be introduced into the electrical vias and sintered. In this regard, it should be appreciated that any suitable metallization of the signal vias 50 is contemplated. Examples of metallization are described in U.S. Pat. Nos. 9,374,892 and 9,691,634, the disclosure of each of which is hereby incorporated by reference as if set forth in its entirety herein.

The first contact pads 38 can be arranged and aligned with each other along a respective row. In one example, the row of first contact pads 38 can be oriented along the lateral direction A. Thus, the first contact pads 38 of a respective row can be aligned with each other along the lateral direction A. Further, the row of electrical contact pads 38 can be disposed adjacent a first or front edge 39 of the package substrate 22. The first or front edge 39 of the package substrate 22 can be opposite a second or rear edge 41 of the package substrate 22 along the longitudinal direction L. It should be appreciated that the first or front edge 39 of the package substrate 22 can be defined by either or both of a first or front edge 44 of the first layer 26 and a first or front edge 46 of the second layer 28. The electrical contact pads 38 can be disposed adjacent the first or front edge 44 of the first layer 26. In one example, the electrical contact pads 38 can extend to the first or front edge 44 of the first layer 26.

It should be appreciated that the first or front edge 44 of the first layer 26 can be inwardly recessed with respect to the first or front edge 46 of the second layer 28. That is, the first or front edge 44 of the first layer 26 can define a first distance to the second or rear edge 41 of the package substrate 22, and the first or front edge 46 of the second layer 28 can define a second distance to the second or rear edge 41 of the package substrate 22 that is greater than the first distance.

The first contact pads 38 and the electrical signal traces 30 can define any suitable width as desired. For instance in one example, the first contact pads 38 can define a width of approximately 250 µm along the lateral direction A, or row direction. Further, the first contact pads 38 can define a center-to-center pitch of approximately 500 µm along the lateral direction A. That is, adjacent ones of the contact pads 38 can be spaced from each other a distance equal to approximately 125 µm along the lateral direction. The terms "approximately" and "substantially" as used herein with respect to distances, sizes, and shapes recognize potential variances in factors including manufacturing tolerances and other factors. Thus, the terms "approximately" and "substantially" as used herein can include the value specified, as well as plus or minus 10 percent of the value specified. It should be appreciated in some examples that the width of the first contact pads 38 can be in a range from approximately 125 µm to approximately 1 mm. In other examples, the width of the first contact pads 38 can be outside of this range. Further, the center-to-center pitch of the first contact pads 38 can be in a range of approximately 250 µm to approximately 2 mm.

The electrical grounds 36 of the electrical cables 32 are configured to be mounted to the second layer 28 so as to be placed in electrical communication with the second layer 28. In particular, the electrical grounds 36 are configured to be placed in electrical communication with respective ones of a respective at least one integrated circuit 24 along respective ones of a plurality of electrical ground traces 45 of the package substrate 22. In particular, the electrical grounds 36 are configured to be mounted to a respective one of a plurality of second or ground electrical contact members that are disposed on the first surface 28a of the second layer 28. The second electrical contact members can be configured as second electrical contact pads 40 that are in electrical communication with respective ones of the electrical ground traces 45. Thus, the second electrical contact pads 38 can also be referred to as ground contact pads. At least some up to all of the electrical ground traces 45 can extend from respective ones of the second electrical contact pads 40 to a respective one of the at least one integrated circuit 24. It should therefore be appreciated that the electrical cables 32 can be configured to be mounted to the substrate 22 such that the electrical signal conductors 34 are mounted to respective ones of the first electrical contact pads 38 of the first layer 26, and the electrical grounds 36 are configured to be mounted to respective ones of the second electrical contact pads 40 of the second layer 28.

It is recognized that first and second contact members can be configured as contact pads 38 and 40 in one example, and that alternatively configured contact members are contemplated. For instance, the contact members can alternatively be configured as disclosed in U.S. Patent Publication No. 2006/0035510, the disclosure of which is hereby incorporated by reference as if set forth in its entirety herein. In this regard, it should be appreciated that any suitable contact member capable of electrically connecting to respective ones the signal conductors 34 and the grounds 36, respectively, and establishing a contact path to the signal traces 30 and the ground traces 45, respectively, are contemplated.

Advantageously, the electrical grounds 36 of the electrical cables 32 can be mounted to respective ones of the second electrical contact pads 40, such that the electrical grounds 36 are in electrical communication with the integrated circuit 24 along the electrical ground traces 45 of the package substrate 22 without passing through any separable interfaces of electrical connectors. Thus, the respective ground paths established by the ground traces 45 can be configured so that they are not subject to degradation at a separable interface. Thus, it can also be said that at least one up to all of the electrical ground traces 45 can extend continuously and uninterrupted from a respective one of the second contact pads 40 to a respective one of the at least one integrated circuit 24.

It should be appreciated that some up to all of the second contact pads 40 can be in communication with the integrated circuit 24 along respective ones of the ground traces 45. Alternatively or additionally, some of the contact pads 38 can be placed in electrical communication with the second substrate 23. In particular, as illustrated in FIG. 3, the package substrate 22 can include electrically conductive ground vias, constructed as described above with respect to vias 50, that extend from respective ones of the ground traces 45 through the substrate 22 so as to mount to the second substrate 23. The electrically conductive ground vias can extend through the second layer 28 along the transverse direction T. In particular, the electrically conductive ground vias can extend from the first surface 28a of the second layer 28 to the second surface 28b of the second layer 28. The ground vias can extend from respective ones of the ground traces 45 that extend from the second contact pads 40. The ground traces 45 that extend from respective second contact pads 40 to respective ground vias can terminate at the ground vias without extending to the integrated circuit 24. The ground traces 45 that extend to the respective one of the at least one integrated circuit 24 can extend uninterrupted to the respective one of the at least one integrated circuit 24 without extending across, past, or through any ground vias. Alternatively, the ground traces 45 that extend to the respective one of the at least one integrated circuit 24 can also be placed in electrical communication with one or more up to all of the ground vias. In this regard, it should be appreciated that two or more up to all of the ground vias can be placed in electrical communication with each other.

The second contact pads 40 can be arranged and aligned with each other along a respective row. In one example, the row of second contact pads 40 can be oriented along the lateral direction A. Thus, the second contact pads 40 of a respective row can be aligned with each other along the lateral direction A. Further, the row of second contact pads 40 can be spaced from the row of first contact pads 38 along the transverse direction T. Further, still the row of second contact pads 40 can be disposed adjacent the first or front edge 39 of the package substrate 22. In particular, the second electrical contact pads 40 can be disposed adjacent the first or front edge 46 of the second layer 28. In one example, the second electrical contact pads 40 can extend to the first or front edge 46 of the second layer 28.

The second contact pads 40 and the electrical ground traces 45 can define any suitable width as desired. Further, second contact pads 40 and the electrical ground traces 45 can be spaced from each other any distance as desired. In one example, the second electrical contact pads 40 can be coplanar with the first electrical contact pads 38 along respective planes that are defined by the transverse direction T and the longitudinal direction L.

In one example, the front edge 44 of the first layer 26 defines a portion of the outer perimeter of the first layer 26 can be recessed inward with respect to the corresponding front edge 46 of the second layer 28 that defines a portion of the outer perimeter of the second layer 28. The inward recess can be along a plane that is substantially perpendicular to the transverse direction T. Thus, the second layer 28 defines an offset region 48 that is outwardly offset with respect to the first layer 36 along the plane. For instance, the offset region 38 can be outwardly offset with respect to the first layer 36 along the longitudinal direction away from the second or rear edge 41 of the package substrate 22. At least a portion of the second electrical contact pads 40 can be disposed in the offset region 48. The offset region 48 can define the front edge 46 of the second layer 28.

Whether the first and second layers 26 and 28 are monolithic with each other, or separate from each other and attached to each other, the offset region 48 can define a first surface 28a of the second layer 28 that faces opposite the second surface 28b. Further, the first surface 28a can face the second surface 26b of the first layer 26 at locations adjacent the offset region 48. The second contact pads 40 can be carried by the first surface 28a at the offset region 48. Thus, the row of second contact pads 40 can be offset with respect to the row of first contact pads 38 along the longitudinal direction L. Accordingly the signal conductors 34 can be mounted to the first contact pads 38 adjacent the front edge 44, and the grounds 36 can be mounted to the second contact pads 40 at the offset region 48.

In one example (see FIG. 2), one or both of the first and second electrical contact pads 38 and 40 can be substantially planar along their respective entireties. For instance, the first and second electrical contact pads 38 and 40 can be substantially planar along respective planes that are substantially normal to the transverse direction T. Tus, the first and second electrical pads 38 and 40 define respective lengths along the longitudinal direction L and respective widths along the lateral direction.

Further, the electrical signal traces 30 can extend in any direction as desired. For instance, a portion of the electrical signal traces 30 can extend along the longitudinal direction L. One or more other portions of a first group of electrical signal traces 30 can extend in a first direction angularly offset with respect to the longitudinal direction L to a respective one of the integrated circuits 24. One or more other portions of a second group of electrical signal traces 30 can extend in a second direction angularly offset with respect to the longitudinal direction L and different than the first direction to a respective other one of the integrated circuits 24. In one example, the package substrate 22 can thus include as many groups of electrical signal traces 30 that extend to a respective one of the integrated circuits 24 as there are integrated circuits 24.

Further still, the electrical ground traces 45 can extend in any direction as desired. For instance, a portion of the electrical ground traces 45 can extend along the longitudinal direction L. One or more other portions of a first group of electrical ground traces 45 can extend in a first direction angularly offset with respect to the longitudinal direction L to a respective one of the integrated circuits 24. One or more other portions of a second group of electrical ground traces 45 can extend in a second direction angularly offset with respect to the longitudinal direction L and different than the first direction to a respective other one of the integrated circuits 24. In one example, the package substrate 22 can thus include as many groups of electrical ground traces 45 that extend to a respective one of the integrated circuits 24 as there are integrated circuits 24.

In another example (see FIG. 3), the first layer 26 can define a plurality of grooves 42 that are configured to receive respective ones of the electrical signal conductors 34 so as to establish an electrical connection between the electrical signal conductors 34 and respective ones of the electrical signal traces 30. Thus, the first electrical contact pads 38 can be disposed in the grooves 42. In one example, the grooves 42 can be defined by the first surface 26a of the first layer 26. The first electrical contact pads 38 can be carried by the first surface 26a in the grooves 42. Thus, when the electrical signal conductors 34 are configured to be mounted to respective ones of the first electrical contact pads 38 inside the corresponding respective ones of the grooves 42.

The grooves 42 can be substantially V-shaped or alternatively shaped as desired in a plane that is defined by the lateral direction A and the transverse direction T. The signal conductors 34 can thus self center inside the grooves 42 so as to seat against the respective contact pads 38. The grooves 42 can further be open the first or front edge 44 of the first layer 26 along the longitudinal direction. Further, the first contact pads 38 can be spaced from the second contact pads 40 a sufficient distance along the transverse direction T such that when the signal conductors 34 of the electrical cables 32 are in contact with respective ones of the first contact pads 38, the grounds 36 are also in contact with the second contact pads 40. The electrical cables 32 can be mounted to the contact pads 38 and 40, respectively, and extend away from the package substrate 22 through the respective first or front edges 44 and 46 of the first and second layers 26 and 28, respectively.

In one example, the signal traces 30 can be the same material as the first electrical contact pads 38. Alternatively, the signal traces 30 can be made from a different material than the first electrical contact pads 38. Similarly, the ground traces 45 can be the same material as the second electrical contact pads 40. Alternatively, the ground traces 45 can be made from a different material than the second electrical contact pads 40. It should be further appreciated that the signal traces 30 can be the same material as the ground traces 45. Alternatively, the signal traces 30 can be a different material than the ground traces 45. In one example, one or more up to all of the signal traces 30, the ground traces 45, the first contact pads 38, and the second contact pads 40 can be made from copper, gold, silver, or any suitable alternative electrically conductive material. For instance, in one example, the contact pads 38 and 40 can be made from copper, and the signal traces 30 and ground traces 45 can be made from gold or silver.

In another example, the at least one electrical cable 32 can be replaced with an optical fiber, and the substrate 22 can carry waveguides that are coupled to the optical fiber and to the integrated circuit. Thus, optical signals can travel between the optical fiber and the integrated circuit along continuous and uninterrupted respective data communication paths as described above.

Figure 5C:
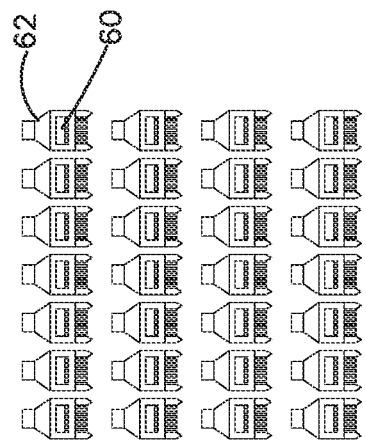
FIG. 5C is a schematic view showing a third molding step of the method of fabricating the electrical connector.
Figure 5B:
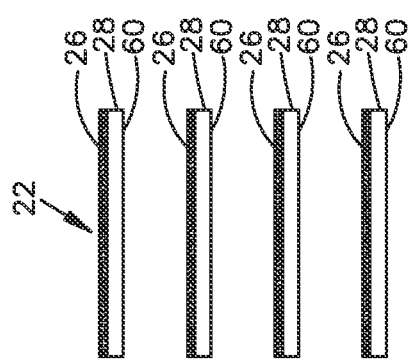
FIG. 5B is a schematic view showing a second dicing step of the method of fabricating the electrical connector.
Figure 5A:
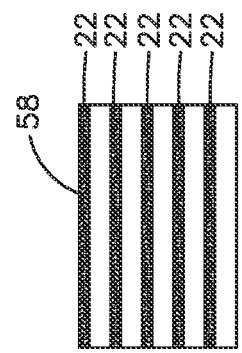
FIG. 5A is a schematic view showing a first wafer processing step of a method of fabricating an electrical connector including the electrical component illustrated in FIG. 1.
Figure 5F:
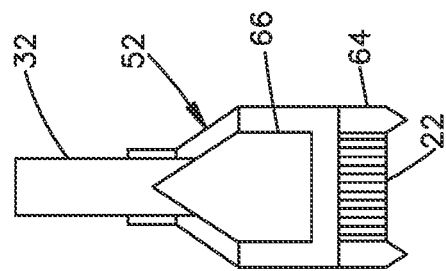
FIG. 5F is a schematic view showing a sixth protecting step of the method of fabricating the electrical connector.

Referring now to FIGS. 5A-5F, methods of producing electrical connectors 52 that include the electrical components 20 are contemplated. The electrical connectors 52 can further include the electrical cables 32. As illustrated in FIG. 5A, the method can include the step of processing one or more wafers 58 that can define one or more of the package substrates 22. The processing step can include the step of metallizing the package substrates 22 so as to define the contact pads 38 and 40, the signal and ground traces 30 and 56, and the electrical signal vias 50 and ground vias. The metallization can be achieved using thin film technology. Alternatively, the metallization can be achieved using thick film technology. Alternatively still, a metal powder can be introduced and sintered. In this regard, it should be appreciated that any suitable metallization is contemplated.

Next, the method can include the step of separating the wafers 58 of FIG. 5A into a one or more glass strips 60 as illustrated at FIG. 5B. Each of the glass strips 60 can define a respective one of the package substrates 22 described herein. The separating step can thus produce a plurality of package substrates 22. Next, referring to FIG. 5C, the method can include the step of applying a resin transfer mold 62 to the glass strips 60. Next, at FIG. 5D, the method can include the step of applying an electrically insulative material, such as a resin, in the resin transfer mold 62. Thus, one or more of the package substrates 20 can be insert molded in the resin, thereby defining the electrical connector 52 as illustrated in FIG. 5D, thereby producing the electrical connector 52. In particular, the electrical connector 52 can include an electrically insulative connector housing 64, and at least one package substrate 22 supported by the electrically insulative connector housing 64. The connector housing 64 can be defined by the resin. In one example, the connector housing 64 can at least partially surround all sides of the package substrate 22 with the exception of the first and second front edges 44 and 46 described above.

Figure 5E:
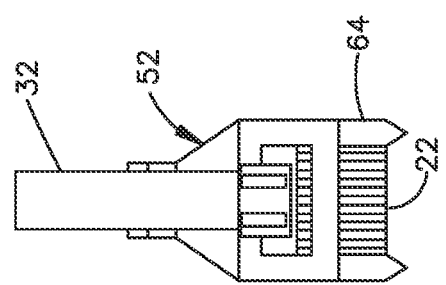
FIG. 5E is a schematic view showing a fifth cable attachment step of the method of fabricating the electrical connector.
Figure 5D:
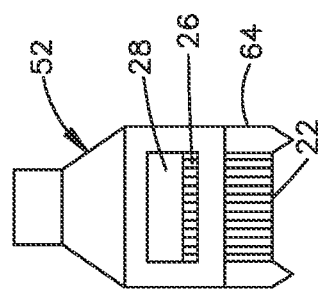
FIG. 5D is a schematic view showing a fourth singulating step of the method of fabricating the electrical connector.

Next, as illustrated at FIG. 5E, the electrical cables 32 can be attached to the package substrates 22 in the manner described above. That is, the electrical signal conductors of the electrical cables 32 can be mounted to the first layer 26, and the electrical grounds of the electrical cables 32 can be mounted to the second layer 28. Finally, an electrically insulative material 66 can be applied to the first and second layers 26 and 28 at the interfaces with the electrical signal conductors and the electrical grounds of the electrical cables 32, respectively. Thus, the interfaces can be embedded in the electrically insulative material, and thus electrically isolated and protected from each other. In particular, the electrical signal conductors 34 and the electrical grounds 36 (see FIG. 2) can be embedded in the electrically insulative material 66. Thus, the electrically insulative material can electrically isolate each of the electrical signal conductors 34 mounted to the first layer 26 and the electrical grounds 36 mounted to the second layer 28. The electrically insulative material 66 can be resin or any suitable electrical insulator. For instance, the electrically insulative material 66 can be the same material as the connector housing 64. Alternatively, the electrically insulative material 66 can be a different material than the connector housing 64.

Figure 2:
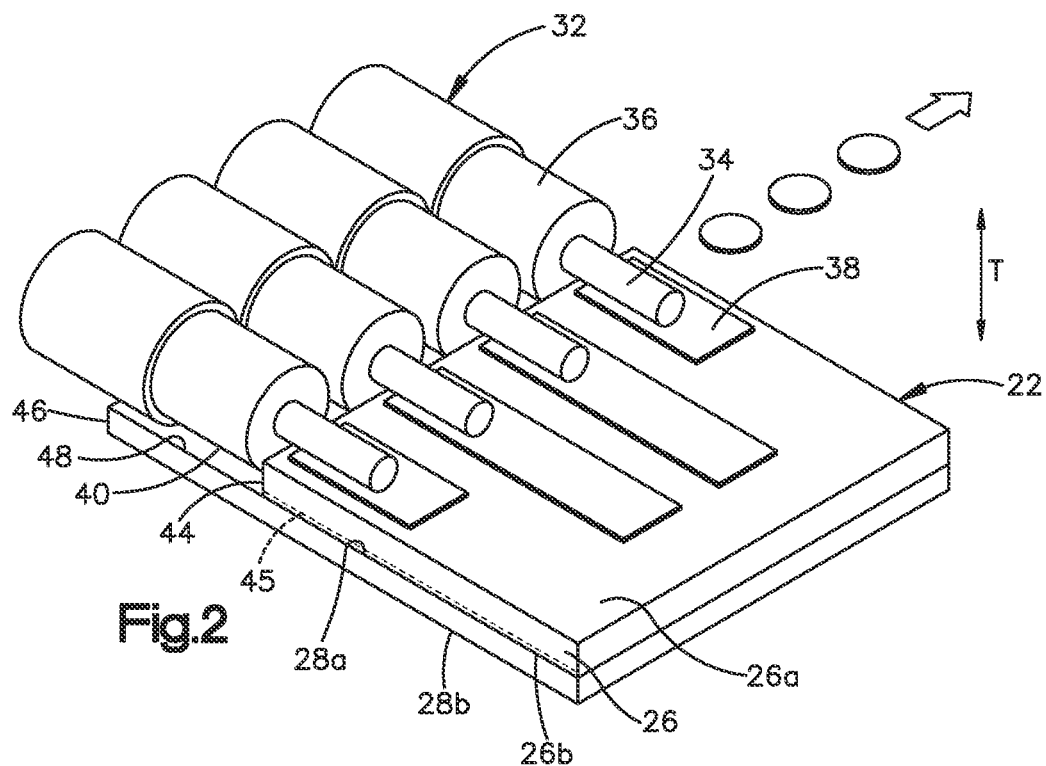
FIG. 2 is an enlarged perspective sectional view of a portion of the electrical component illustrated in FIG. 1 in accordance with one embodiment.

Referring now to FIG. 6, the electrical component 20 can include a protective cover 56 that attaches to one or both of the package substrate 22 and the second substrate 23 so as to substantially encapsulate and protect the integrated circuits 24 and at least a portion of the signal traces 30 and ground traces 45 (see FIG. 2). The cover 56 can define a pocket 68 that is configured to receive the electrical cables 32 as the electrical cables 32 are mounted to the package substrate 22. Thus, the cover 56 can be applied to the package substrate 22 prior to mounting the electrical cables 32 to the package substrate 22. Alternatively, the cover 56 can be applied to the package substrate 22 after mounting the electrical cables 32 to the package substrate 22.

It should be appreciated that methods of fabricating the electrical component can include the step of mounting at least one electrical cable 32, such as a plurality of electrical cables 32, to the package substrate 22 in the manner described herein. The method can further include the steps of mounting the package substrate 22 to the second substrate 23 such that the signal vias 50 and the ground vias are placed in electrical communication with the second substrate 23. The method can further include the step of attaching the cover 56 to one or both of the package substrate 22 and the second substrate 23, such that the cover substantially encapsulates the at least one integrated circuit 24 and at least a portion of the electrical signal traces 30. The step of attaching the cover 56 can include the step of aligning the pocket with the first contact pads 38 along the transverse direction T.

Although there has been shown and described the preferred embodiment of the present disclosure, it will be readily apparent to those skilled in the art that modifications may be made thereto which do not exceed the scope of the appended claims. The embodiments described in connection with the illustrated embodiments have been presented by way of illustration, and the present invention is therefore not intended to be limited to the disclosed embodiments. Furthermore, the structure and features of each the embodiments described above can be applied to the other embodiments described herein. Accordingly, those skilled in the art will realize that the invention is intended to encompass all modifications and alternative arrangements included within the spirit and scope of the invention, as set forth by the appended claims.

What is claimed:
1. An electrical component comprising:
a substrate having an uppermost layer and a second layer disposed below the uppermost layer; and
an integrated circuit mounted to an uppermost surface of the uppermost layer, such that an electrical signal trace of the substrate is in electrical communication with the integrated circuit,
wherein an electrical signal conductor of an electrical cable is configured to be mounted to the uppermost surface of the uppermost layer so as to be placed in electrical communication with the integrated circuit along the electrical signal trace of the substrate, and an electrical ground of the electrical cable that is electrically insulated from the electrical signal conductor by an insulator and wherein the electrical ground is configured to be mounted to the second layer, and wherein the electrical signal conductor extends out from the insulator.

2. The electrical component as recited in any claim 1, wherein the electrical signal trace extends along the uppermost layer of the substrate.

3. The electrical component as recited in claim 1, wherein the uppermost layer and second layer define respective electrical contact members, and the electrical signal trace extends from the electrical contact member of the uppermost layer to the integrated circuit.

4. The electrical component as recited in claim 3, wherein the electrical contact members of one or both of the uppermost layer and second layer are substantially planar along its respective entirety.

5. The electrical connector as recited in claim 4, wherein the electrical signal conductor is configured to be mounted to the electrical contact member of the uppermost layer, and the electrical ground is configured to be mounted to the electrical contact member of the second layer.

6. The electrical component as recited in claim 4, wherein the uppermost layer defines a groove that comprises the electrical contact member of the uppermost layer, and the groove receives the electrical signal conductor such that the electrical signal conductor is mounted to the electrical contact member of the uppermost layer inside the groove.

7. The electrical component as recited in claim 6, wherein the groove of the uppermost layer is defined by the uppermost surface of the first layer that faces away from the second layer.

8. The electrical component as recited in claim 7, wherein the groove is open to an outer perimeter of the uppermost layer along a direction that is substantially perpendicular to a direction along which the uppermost layer faces the second layer.

9. The electrical component as recited in claim 8, wherein the electrical signal trace extends along the surface of the uppermost layer that faces away from the second layer.

10. The electrical component as recited in claim 6, wherein the electrical signal trace extends from the electrical contact member of the uppermost layer to the integrated circuit so as to place the electrical contact member of the uppermost layer in electrical communication with the integrated circuit.

11. The electrical component as recited in claim 3, wherein:
the uppermost surface faces away from the second layer, and the second layer defines a second surface that faces away from the first layer, and
the first and second surfaces of each of the first and second layers are opposite each other along a transverse direction, and the uppermost layer is recessed with respect to the second layer along a plane that is oriented substantially normal to the transverse direction, such that the second layer defines an offset region that is outwardly offset with respect to the uppermost layer along the plane.

12. The electrical component as recited in claim 11, wherein the electrical contact member of the second layer is disposed at the offset region.

13. The electrical component as recited in claim 3, wherein the electrical signal traces establishes an electrical path from the contact member to the integrated circuit without passing across a separable interface of an electrical connector.

14. The electrical component as recited in claim 3, wherein the electrical signal traces extends continuously and uninterrupted from the contact member to the integrated circuit.

15. The electrical component as recited in claim 1, wherein the electrical cable is configured to be mounted to the substrate so as to be placed in electrical communication with the integrated circuit without signals transmitted across a separable interface of an electrical connector.

16. An electrical component comprising:
a package substrate defining a plurality of electrical signal contact members;
an integrated circuit mounted to an uppermost surface of an uppermost layer of the package substrate, such that a plurality of electrical signal traces of the package substrate is in electrical communication with the integrated circuit; and
a plurality of electrical cables mounted to the package substrate, such that 1) electrical signal conductors of the electrical cables are mounted to the uppermost surface and in electrical communication with the electrical signal traces, respectively, and 2) electrical ground shields of the electrical cables are mounted to a second layer of the package substrate that is below the uppermost layer,
wherein the electrical signal traces extend continuously and uninterrupted from the electrical signal contact members to the integrated circuit without passing through any separable interfaces of an electrical connector, wherein the electrical ground shields of the electrical cables are electrically isolated from the electrical signal conductors by respective insulators, and wherein the electrical signal conductors extend out from the respective insulators.

17. The electrical component as recited in claim 16, wherein
the electrical signal traces extend along the uppermost layer.

18. The electrical component as recited in claim 17, further comprising a plurality of ground traces that extend along the second layer.

19. The electrical component as recited in claim 18, wherein the second layer defines an offset region that extends out with respect to a front edge of the uppermost layer.

20. The electrical component as recited in claim 19, further comprising a plurality of contact members at the offset region, wherein an electrical ground of an electrical cable is configured to be mounted to a respective one of the contact members.

21. The electrical component as recited in claim 20, wherein the uppermost layer defines a respective plurality of electrical contact members adjacent the front edge of the uppermost layer, wherein an electrical signal conductor of the electrical cable is configured to be mounted to a respective one of the contact members of the uppermost layer.

* * * * *